(12) United States Patent
Kanematsu et al.

(10) Patent No.: US 9,257,574 B2
(45) Date of Patent: Feb. 9, 2016

(54) DIODE AND METHOD OF MANUFACTURING DIODE

(71) Applicant: Sony Corporation, Tokyo (JP)

(72) Inventors: Shigeru Kanematsu, Kanagawa (JP); Masashi Yanagita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 146 days.

(21) Appl. No.: 13/972,037

(22) Filed: Aug. 21, 2013

(65) Prior Publication Data

US 2014/0061846 A1 Mar. 6, 2014

(30) Foreign Application Priority Data

Aug. 31, 2012 (JP) ................ 2012-191476

(51) Int. Cl.
| | |
|---|---|
| *H01L 29/872* | (2006.01) |
| *H01L 29/47* | (2006.01) |
| *H01L 21/02* | (2006.01) |
| *H01L 29/66* | (2006.01) |
| *H01L 29/861* | (2006.01) |
| *H01L 29/20* | (2006.01) |

(52) U.S. Cl.
CPC ........ *H01L 29/872* (2013.01); *H01L 21/02104* (2013.01); *H01L 29/66204* (2013.01); *H01L 29/66212* (2013.01); *H01L 29/861* (2013.01); *H01L 29/2003* (2013.01)

(58) Field of Classification Search
CPC ...................................................... H01L 29/872
USPC ............ 257/73, 155, 156, 471, 472, E21.359, 257/E21.368, E29.338, E33.051
See application file for complete search history.

(56) References Cited

U.S. PATENT DOCUMENTS

| | | | | |
|---|---|---|---|---|
| 7,531,889 B2* | 5/2009 | Kiyama et al. | ................ | 257/615 |
| 8,502,310 B2* | 8/2013 | Shiomi et al. | ................ | 257/339 |
| 8,502,337 B2* | 8/2013 | Horii et al. | ................ | 257/473 |
| 8,513,683 B2* | 8/2013 | Maeda et al. | ................ | 257/94 |
| 8,581,359 B2* | 11/2013 | Horii et al. | ................ | 257/471 |
| 8,890,278 B2* | 11/2014 | Kameshiro et al. | ........... | 257/471 |
| 8,901,698 B2* | 12/2014 | Horii et al. | ................ | 257/473 |
| 2004/0124424 A1* | 7/2004 | Tatsumi | ................ | 257/79 |
| 2004/0206975 A1* | 10/2004 | Tojo et al. | ................ | 257/103 |
| 2004/0245540 A1* | 12/2004 | Hata et al. | ................ | 257/99 |
| 2006/0038166 A1* | 2/2006 | Tsuda et al. | ................ | 257/13 |
| 2006/0192209 A1* | 8/2006 | Maeda et al. | ................ | 257/79 |
| 2010/0059761 A1* | 3/2010 | Horii et al. | ................ | 257/76 |
| 2011/0133210 A1* | 6/2011 | Horii et al. | ................ | 257/76 |
| 2011/0198693 A1* | 8/2011 | Shiomi et al. | ................ | 257/339 |

(Continued)

*Primary Examiner* — Earl Taylor
(74) *Attorney, Agent, or Firm* — Hazuki International, LLC

(57) ABSTRACT

A diode includes a first semiconductor layer configured by a compound semiconductor containing impurities of a first conductivity type; a high dislocation density region; a second semiconductor layer which is laminated on the first semiconductor layer, which is lower in a concentration of impurities in a region of a side of an interface with the first semiconductor layer than that of the first semiconductor layer, and which has an opening in which a portion which corresponds to the high dislocation density region is removed; an insulating film pattern which is provided to cover an inner wall of the opening; an electrode which is provided so as to cover the insulating film pattern and to contact the second semiconductor layer; and an opposing electrode which is provided to interpose the first semiconductor layer, the second semiconductor layer and the insulating film pattern between the electrode and the opposing electrode.

17 Claims, 6 Drawing Sheets

(56) References Cited

U.S. PATENT DOCUMENTS

| | | | |
|---|---|---|---|
| 2013/0020585 A1* | 1/2013 | Ishibashi | 257/77 |
| 2013/0056743 A1* | 3/2013 | Bour et al. | 257/76 |
| 2013/0140584 A1* | 6/2013 | Kameshiro et al. | 257/77 |
| 2013/0292695 A1* | 11/2013 | Horii et al. | 257/76 |
| 2014/0061846 A1* | 3/2014 | Kanematsu et al. | 257/472 |

* cited by examiner

DIODE AND METHOD OF MANUFACTURING DIODE

BACKGROUND

The present disclosure relates to a diode and a method of manufacturing a diode. In particular, the present disclosure relates to a diode of a configuration in which electrodes are provided on both surfaces of a semiconductor layer which is configured using a compound semiconductor and a method of manufacturing the diode.

Gallium nitride (GaN), which is a compound semiconductor with a wide band gap, from the perspective of the physical properties thereof, is being focused on not only as a semiconductor material for optical devices, but also for power devices such as power supplies and inverters. This is because, in comparison with existing power devices which use silicon (Si), it is possible to realize a device of higher efficiency and higher performance.

In the manufacturing of such a power device system diode, generally, a gallium nitride layer is used which is epitaxially grown on a supporting substrate formed from different types of single crystal material such as silicon carbide (SiC), sapphire ($Al_2O_3$) and silicon (Si). In this case, a method of epitaxially growing a gallium nitride layer in a lateral direction in relation to a supporting substrate (epitaxial lateral overgrowth: ELO) is adopted as a method for obtaining a gallium nitride layer of favorable crystalline properties.

However, in a gallium nitride layer obtained using such epitaxial growth, a region containing a higher density of crystal defects than the other portions is generated as a threading dislocation region which penetrates the layer. Therefore, in a vertical device provided with electrodes in a state of interposing the layer, when such a threading dislocation region encroaches on the junction surface between the layer and the electrode, an ideal junction is not formed in the region and there is a concern that this will result in the occurrence of a leak current.

Therefore, a configuration is disclosed in which, in a gallium nitride layer obtained using epitaxial growth, a groove is formed in the region of a high threading dislocation density, a silicon nitride film is formed within the groove using patterning, and an electrode is formed to bridge over the silicon nitride film. According to this configuration, it is possible to reduce the influence of the threading dislocation while increasing the device surface area (refer to Japanese Unexamined Patent Application Publication No. 2007-184371 and Japanese Unexamined Patent Application Publication No. 2008-130927).

SUMMARY

However, in addition to the epitaxial growth of the semiconductor layer configured by a compound semiconductor, the threading dislocation region described above does not only extend in the thickness direction of the semiconductor layer, but there are also threading dislocation regions which extend in a diagonal direction. Therefore, in the configurations disclosed in Japanese Unexamined Patent Application Publication No. 2007-184371 and Japanese Unexamined Patent Application Publication No. 2008-130927, it is difficult to suppress the influence of a threading dislocation region which extends in a diagonal direction in relation to the thickness direction of the semiconductor layer.

Accordingly, it is desirable that an embodiment of the present disclosure provide a diode capable of securely preventing the occurrence of a leak current via a threading dislocation region in the semiconductor layer configured by the compound semiconductor.

According to a first embodiment of the present disclosure, there is provided a diode including a first semiconductor layer configured by a compound semiconductor of a crystalline structure containing impurities of a first conductivity type, and a second semiconductor layer which has a crystalline structure continuous with the first semiconductor layer, which is laminated on the first semiconductor layer. The first semiconductor layer is a diode which includes a high dislocation density region which penetrates the first semiconductor layer. In the second semiconductor layer, a concentration of the impurities is lower in a region of a side of an interface with the first semiconductor layer than that of the first semiconductor layer, and the second semiconductor layer has an opening in which a portion which corresponds to the high dislocation density region is removed such that the first semiconductor layer is in an exposed state. An insulating film pattern is provided in a state of covering an inner wall including a base portion of the opening. Furthermore, an electrode is provided so as to cover the insulating film pattern and to contact the second semiconductor layer. In addition, an opposing electrode is provided in a state of interposing the first semiconductor layer, the second semiconductor layer and the insulating film pattern between the electrode and the opposing electrode so as to contact the first semiconductor layer including the high dislocation density region.

In the first embodiment of the present disclosure described above, according to the presence of the insulating film pattern provided on the second semiconductor layer side corresponding to the high dislocation density region, the electrode of the second semiconductor layer side is provided without making contact with the high dislocation density region. Therefore, a vertical diode is provided in which a laminated body of the first semiconductor layer and the second semiconductor layer, which are configured by a compound semiconductor, is interposed between the electrode and the opposing electrode over a wide range including the high dislocation density region.

In addition, particularly in such a vertical diode, the opening provided with the insulating film pattern is formed in the second semiconductor layer such that the first semiconductor layer is in an exposed state. Therefore, the high dislocation density region is present only in the first semiconductor layer portion, in a state of being interposed between the opposing electrode and the insulating film pattern. Here, the second semiconductor layer provided with an opening has a lower impurity concentration than the first semiconductor layer in the interface region of the first semiconductor layer side. Therefore, even when a depletion layer is formed within the second semiconductor layer up to the vicinity of the interface between the second semiconductor layer and the first semiconductor layer by applying a reverse bias between the electrode and the opposing electrode when turning the diode off, the high dislocation density region does not reach the inside of the depletion layer. Accordingly, the occurrence of a leak current is securely prevented by a depletion layer in which voltage resistance is secured due to the absence of the high dislocation density region.

In addition, according to a second embodiment of the present disclosure, there is provided a semiconductor layer which is configured by a compound semiconductor of a crystalline structure, includes a high dislocation density region which penetrates the layer in a thickness direction, and includes an opening, in which the high dislocation density region is removed, on a primary surface side. An insulating film pattern is provided in a state of covering an inner wall including a base portion of the opening. Furthermore, an electrode is provided so as to cover the insulating film pattern and to contact the semiconductor layer. In addition, an opposing electrode which is provided in a state of interposing the semiconductor layer and the insulating film pattern between the electrode and the opposing electrode so as to contact the semiconductor layer including the high dislocation density region described earlier, and to which, and to the electrode, a voltage is applied to form a depletion layer shallower than the opening in the semiconductor layer.

In the second embodiment of the present disclosure described above, according to the presence of the insulating film pattern provided on the primary surface side of the semiconductor layer corresponding to the high dislocation density region, the electrode provided so as to cover the insulating film pattern is provided without making contact with the high dislocation density region. Therefore, a vertical device is disposed in which the semiconductor layer configured by a compound semiconductor is interposed between the electrode and the opposing electrode over a wide range including the high dislocation density region.

In addition, particularly in such a vertical device, the electrode and the opposing electrode, which are disposed in a state of interposing the semiconductor layer, form a depletion layer shallower than the opening provided with the insulating film pattern in the semiconductor layer. Therefore, when the depletion layer is formed within the semiconductor layer by applying a reverse bias between the electrode and the opposing electrode during the current-off operation, the high dislocation density region does not reach the inside of the depletion layer. Accordingly, the occurrence of a leak current during a current-off operation is securely prevented by a depletion layer in which voltage resistance is secured due to the absence of the high dislocation density region.

Furthermore, an embodiment of the present disclosure is also a method of manufacturing the diode according to the first embodiment of the present disclosure described above, in which the following processes are performed. First, a mask layer which includes an opening portion on the supporting substrate is formed. Next, a first semiconductor layer is formed which includes a high dislocation density region, which penetrates in a film thickness direction, to correspond to the opening portion. The first semiconductor layer is configured by a compound semiconductor of a crystalline structure containing impurities of a first conductivity type by inducing epitaxial growth from an exposed surface of the supporting substrate to above the mask layer in the opening portion. Subsequently, according to the epitaxial growth which is continuous from the first semiconductor layer, the second semiconductor layer is formed in which a concentration of the impurities is lower in a region of a side of an interface with the first semiconductor layer than that of the first semiconductor layer. Next, an opening in which a portion which corresponds to the high dislocation density region is removed such that the first semiconductor layer is in an exposed state is formed in the second semiconductor layer. Next, an insulating film pattern is formed in a state of covering an inner wall including a base portion of the opening. Subsequently, an electrode is formed so as to cover the insulating film pattern and to contact the second semiconductor layer. Furthermore, after removing the supporting substrate and the mask layer from the first semiconductor layer, an opposing electrode is formed in a state of interposing the first semiconductor layer, the second semiconductor layer and the insulating film pattern between the electrode and the opposing electrode so as to contact the first semiconductor layer including the high dislocation density region.

As described above, according to the diode of an embodiment of the present disclosure, it becomes possible to securely prevent the occurrence of a leak current via a high dislocation density region which penetrates the semiconductor layer configured by a compound semiconductor.

DETAILED DESCRIPTION OF EMBODIMENTS

Hereinafter, embodiments of the present disclosure are described in the following order on the basis of the drawings.

1. The first embodiment (an example of a Schottky diode in which an insulating film pattern is provided within the opening).

2. The second embodiment (an example which includes an insulating film pattern which projects from the opening in the surface direction).

3. The third embodiment (an example in which the electrodes are proximal).

4. The fourth embodiment (an example in which an embedded electrode is provided within the opening via an insulating film pattern).

5. The fifth embodiment (an example of a pn-junction diode in which an insulating film pattern is provided within the opening).

6. The sixth embodiment (another example of a Schottky diode in which an insulating film pattern is provided within the opening).

1. First Embodiment

Figure 1:
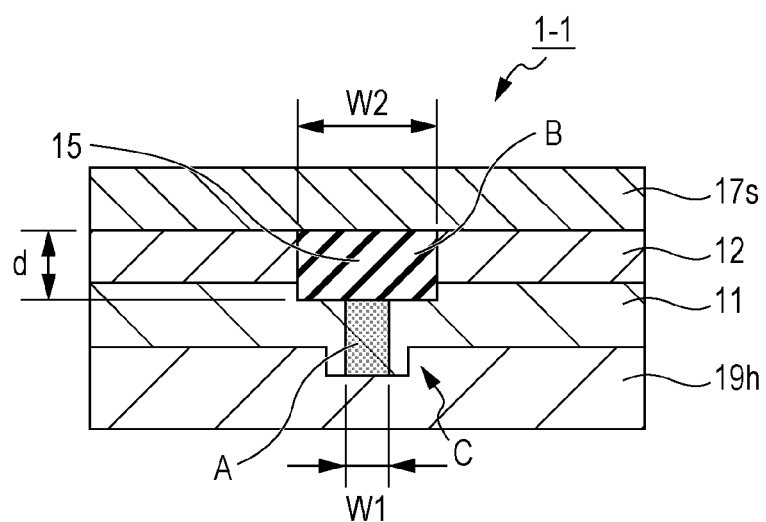
FIG. 1 is a cross-sectional view of a diode of a first embodiment.

Example of Schottky Diode in which Insulating Film Pattern is Provided Within Opening FIG. 1 is a cross-sectional view of the diode of the first embodiment. Below, description will be given of the configuration of the diode of the first embodiment on the basis of this drawing.

The diode 1-1 shown in FIG. 1 is a vertical Schottky diode which uses a compound semiconductor. The diode 1-1 has a vertical device structure including a first semiconductor layer 11, a second semiconductor layer 12 laminated thereon, a Schottky electrode 17s disposed so as to interpose the laminated body, and an ohmic electrode 19h, for example, as the opposing electrode corresponding to the Schottky electrode 17s. For example, the first semiconductor layer 11 intrinsically contains a high dislocation density region A which penetrates in the film thickness direction at a predetermined position due to the film formation process. Furthermore, in particular, the diode 1-1 according to the first embodiment of the present disclosure is provided with an opening B in a position corresponding to the high dislocation density region A of the second semiconductor layer 12, an insulating film pattern 15 is provided on the inner portion of the opening B, and the Schottky electrode 17s is provided to cover the insulating film pattern 15.

Below, detailed description will be given of the configuration of the diode 1-1 according to the first embodiment in the order of the first semiconductor layer 1-1, the second semiconductor layer 12, the opening B, the insulating film pattern 15, the Schottky electrode 17s and the ohmic electrode 19h. Subsequently, description will be given of the method of manufacturing the diode 1-1.

First Semiconductor Layer 11

The first semiconductor layer 11 is a layer configured by a compound semiconductor of a crystalline structure which is formed using epitaxial growth, and here, is configured by a group III-V nitride semiconductor. For example, the group III-V nitride semiconductor is one of gallium nitride (GaN), indium gallium nitride ($In_xGa_{1-x}N$: $0<x\leq1$) and aluminum gallium nitride ($Al_xGa_{1-x}N$: $0<x\leq1$). Since these group III-V nitride semiconductors have a wide band gap in comparison with silicon (Si), they are favorable as semiconductors for power devices.

In addition, the first semiconductor layer 11 which is configured by these group III-V nitride semiconductors includes a high dislocation density region A which penetrates the layer in the film thickness direction. The high dislocation density region A is a region with a high crystal dislocation density in comparison with the other portions in the first semiconductor layer 11.

The high dislocation density region A is generated within the first semiconductor layer 11 in positions such as those described below. In other words, for example, when the first semiconductor layer 11 is a crystalline layer obtained by using the ELO (epitaxial lateral overgrowth) method, the high dislocation density region A is generated in the first semiconductor layer 11 at a portion at which the crystal growth was initiated. Furthermore, when the first semiconductor layer 11 is formed using the ELO method, a step forms on the first semiconductor layer 11 at the initiation portion of the epitaxial growth and the periphery thereof. Therefore, a convex portion C is formed in which the film of the first semiconductor layer 11 grows thicker at the initiation portion, and the high dislocation density region A is generated in the vicinity of the center of the convex portion C.

In addition, when the first semiconductor layer 11 is epitaxially grown from a plurality of locations on the same surface, the junction portion between the epitaxial growth layers becomes a high dislocation density region A, which is a threading dislocation.

The first semiconductor layer 11 as described above contains n-type impurities, and the entire region of the first semiconductor layer 11 is configured as an n-type high concentration region. Furthermore, when the first semiconductor layer 11 is a group III-V nitride semiconductor, Si or the like is used as the n-type impurity.

Second Semiconductor Layer 12

The second semiconductor layer 12 is a layer which has a crystalline structure continuous with the first semiconductor layer 11, is laminated on the first semiconductor layer 11 and is provided on an upper portion of the first semiconductor layer 11. The second semiconductor layer 12 is a layer containing impurities of a first conductivity type, and is a region which operates actively in the vertical Schottky diode (the diode 1-1). For example, the second semiconductor layer 12 is configured by the same compound semiconductor as the first semiconductor layer 11, and is formed using epitaxial growth which is continuous from the film formation of the first semiconductor layer 11. Accordingly, in the first semiconductor layer 11, the portion of the second semiconductor layer 12 on a region, which has a low crystal dislocation density and favorable crystalline properties, is formed as a region with favorable crystalline properties. Meanwhile, in the first semiconductor layer 11, the portion of the second semiconductor layer 12 on the high dislocation density region A, which has a high crystal dislocation density, is formed as a region with a high crystal dislocation density.

In addition, the entire region of the second semiconductor layer 12, including the region of the side of the interface with the first semiconductor layer 11, is configured as an n-type low concentration region which contains n-type impurities of the same type as those of the first semiconductor layer 11 at a lower concentration than in the first semiconductor layer 11.

Opening B

The opening B is formed on the second semiconductor layer 12 and is provided in a state in which a portion corresponding to the high dislocation density region A is removed. The opening B is provided in the first semiconductor layer 11 in a portion which overlaps the high dislocation density region A. Thus, the opening B is provided in a state of penetrating the second semiconductor layer 12 so as to expose the first semiconductor layer 11 through the base portion. Furthermore, the opening B may also be formed deeper than the second semiconductor layer 12. A depth d of the opening B is greater than the film thickness of the second semiconductor layer 12, and may also be of a size at which a part of the first semiconductor layer 11 including the high dislocation density region A is removed.

Here, when the opening B is formed deeper than the second semiconductor layer 12, the depth d is set according to the drive voltage of the diode 1-1, that is, the voltage applied between the Schottky electrode 17s and the ohmic electrode 19h. In this case, as described below, when the depletion layer, which is formed within the second semiconductor layer 12 according to the voltage applied between the Schottky electrode 17s and the ohmic electrode 19h during the application of a reverse bias, is formed so as to spread further to the first semiconductor layer 11, the opening B is formed deeper than the depletion layer. Furthermore, the opening B described above is of a depth d which does not reach the ohmic electrode 19h.

In addition, the opening B is provided in a state of completely covering the high dislocation density region A. Therefore, when the width of the high dislocation density region A is W1, the width W2 of the opening B is W2>W1, and the opening B is formed in a state of completely covering the high dislocation density region A when viewed in a planar manner. Furthermore, the size of the opening B when viewed in a planar manner may also be of a size which covers the convex portion C of the first semiconductor layer 11, and may also be of a size within that of the convex portion C.

Insulating Film Pattern 15

The insulating film pattern 15 is provided in a state of covering an inner wall including a base portion of the opening B. For example, the insulating film pattern 15 is provided in a state of filling the opening B, and is provided such that the surface of the second semiconductor layer 12 and the surface of the insulating film pattern 15 are of approximately the same height. Furthermore, the insulating film pattern 15 has only to be provided so as to cover the inner wall of the opening B, and a void may also be formed within the opening B. However, the film thickness of the insulating film pattern 15 which covers the inner wall of the opening B is sufficient to ensure that insulation breakdown, caused by an electrical field which occurs when driving the diode 1-1, does not occur in the insulating film pattern 15.

For example, the insulating film pattern 15 is configured by an insulative material such as silicon oxide or silicon nitride. In addition, the insulating film pattern 15 is not limited to a single layer structure, and may also be a laminated structure of a plurality of laminated insulative materials.

Schottky Electrode 17s

The Schottky electrode 17s is provided so as to cover the insulating film pattern 15 and to contact the second semiconductor layer 12. The Schottky electrode 17s is configured by a material which forms a Schottky junction with the second semiconductor layer 12. In general, as the electrode material which configures the Schottky electrode 17s, a metal such as nickel (Ni), palladium (Pd) or platinum (Pt) is used, and a film or the like of the metal laminated with gold (Au) or the like is used.

Ohmic Electrode 19h

The ohmic electrode 19h is provided in a state of contacting the first semiconductor layer 11 including the high dislocation density region A, and is provided as the opposing electrode in relation to the Schottky electrode 17s. The ohmic electrode 19h is provided as an electrode which retrieves an electric potential of the first semiconductor layer 11. For example, the ohmic electrode 19h is configured by a material which forms an ohmic junction with the first semiconductor layer 11. A laminated film of Ti/Al or the like is used as the electrode material which configures the ohmic electrode 19h formed on the first semiconductor layer 11 which is configured by a group III-V nitride semiconductor.

As such, the vertical Schottky diode is configured by joining the Schottky electrode 17s to the second semiconductor layer 12 which is configured as a n-type low concentration region, and joining the ohmic electrode 19h to the first semiconductor layer 11 which is configured as a n-type high concentration region. Furthermore, here, the opposing electrode in relation to the Schottky electrode 17s is the ohmic electrode 19h. However, the ohmic electrode 19h has only to be provided as an electrode which retrieves an electric potential of the first semiconductor layer 11, and it is not necessary that the ohmic electrode 19h form an ohmic junction with the first semiconductor layer 11. The same applies to the ohmic electrodes shown in the following embodiments.

Method of Manufacturing Diode 1-1

FIGS. 2A to 2D and 3A to 3C are cross-sectional process drawings showing the method of manufacturing the diode 1-1 of the configuration described above. Next, on the basis of these drawings, description will be given of a manufacturing method to which the crystal growth method of the compound semiconductor using the ELO method is applied as an example of the method of manufacturing the diode of the first embodiment.

FIG. 2A

Figure 2A:
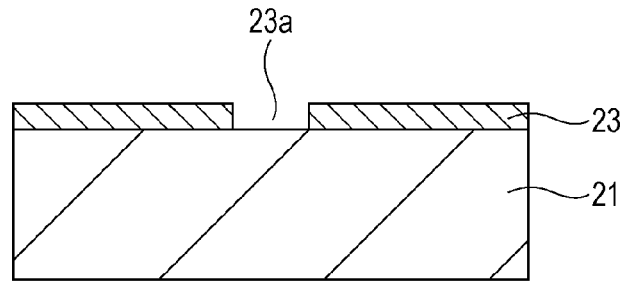
FIGS. 2A to 2D are (the first) cross-sectional process drawings showing a manufacturing process of the diode of the first embodiment.

First, as shown in FIG. 2A, a mask layer 23 is formed on a supporting substrate 21. The supporting substrate 21 is a substrate which has a single crystal structure for the epitaxial growth of a compound semiconductor layer. For example, the supporting substrate 21 is configured by silicon carbide (SiC), sapphire ($\alpha$-$Al_2O_3$), or silicon (Si). The mask layer 23 is the layer which acts as a mask when the compound semiconductor layer is epitaxially grown from the exposed surface of the supporting substrate 21. For example, the mask layer 23 is configured by silicon oxide. The mask layer 23 includes an opening portion 23a which exposes a part of the supporting substrate 21. The opening portion 23a is formed in stripe shapes or island shapes according to the portion at which the device is formed.

After the film formation of the silicon oxide film, the formation of the mask layer 23 provided with the opening portion 23a is performed by removing a part of the silicon oxide film using a photoresist as a mask and forming the opening portion 23a.

FIG. 2B

Figure 2B:
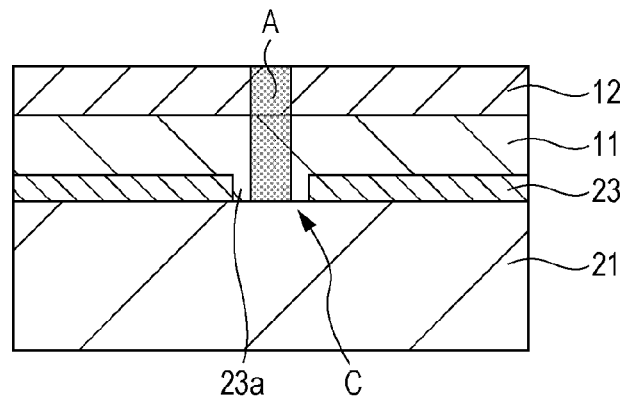
Figure 2C:
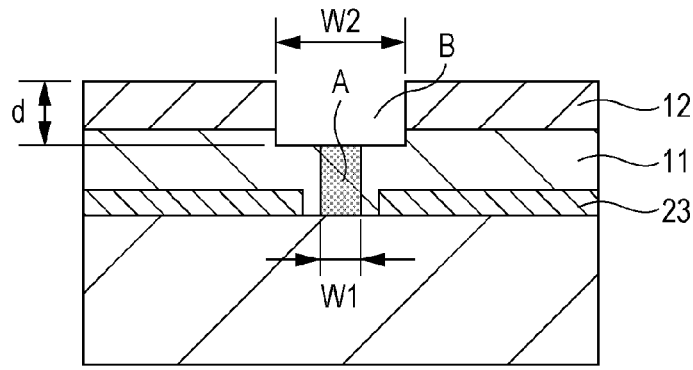

As shown in FIG. 2B, the first semiconductor layer 11 which is configured by the compound semiconductor is formed on the supporting substrate 21 and the mask layer 23 by inducing epitaxial growth from the exposed surface of the supporting substrate 21 to above the mask layer 23. Here, for example, the first semiconductor layer 11 which is configured by a group III-V nitride semiconductor (for example, GaN) is formed in a state of containing a high concentration of n-type impurities in advance. In this case, on the exposed surface of the supporting substrate 21 on which the epitaxial growth is initiated, the first semiconductor layer 11 grows while generating a comparatively high concentration of crystal dislocations in the vicinity of the center of the exposed surface, and the high dislocation density region A which has a high crystal dislocation density develops in the film thickness direction. The high dislocation density region A is generated in a state of penetrating the first semiconductor layer 11 in the film thickness direction.

In addition, the growth of the first semiconductor layer 11 toward above the mask layer 23 is crystal growth from the crystal portion, which is grown on the exposed surface of the supporting substrate 21, toward the surface direction. Therefore, the growth of the first semiconductor layer 11 is epitaxial growth in which a low dislocation density is maintained without receiving the influence of the high dislocation density region A. In the first semiconductor layer 11 which is grown in this manner, a portion which corresponds to the opening portion 23a of the mask layer 23 is a convex portion C which has a greater film thickness in comparison with the film thickness of the periphery thereof. Therefore, the high dislocation density region A is generated in the vicinity of the center of the convex portion C.

Subsequently, the second semiconductor layer 12 which has a lower concentration of n-type impurities than the first semiconductor layer 11 is epitaxially grown from the surface of the first semiconductor layer 11. Here, the second semiconductor layer 12 is epitaxially grown so as to inherit the crystalline properties of the first semiconductor layer 11. Therefore, in the second semiconductor layer 12, the high dislocation density region A which has a high crystal dislocation density is generated so as to penetrate in the film thickness direction. In addition, since the other portions are formed using crystal growth on a region which has a low dislocation density or using lateral direction crystal growth, a low crystal dislocation density is maintained.

Furthermore, in the drawings, a case is illustrated in which the first semiconductor layer 11 and the second semiconductor layer 12 are epitaxially grown from the opening portion 23a of one location provided on the mask layer 23. However, when a plurality of the opening portions 23a is formed in the mask layer 23, the first semiconductor layer 11 and the second semiconductor layer 12 are epitaxially grown above the mask layer 23 in island shapes from the plurality of the opening portions 23a. Furthermore, when the first semiconductor layer 11 or the second semiconductor layer 12 which are epitaxially grown proximal to each other spread out in the surface direction, thereby becoming unified, the high dislocation density region A is also generated as a threading dislocation in the junction portion.

FIG. 2C

Subsequent to the processes described above, as shown in FIG. 2C, the opening B in which the high dislocation density region A is removed is formed in the second semiconductor layer 12. Here, a resist pattern (illustration omitted) is formed on the upper portion of the supporting substrate 21 in a state of covering the second semiconductor layer 12. The resist pattern is provided with an opening which completely contains the high dislocation density region A when viewed in a planar manner. Subsequently, the second semiconductor layer 12 is etched using the resist pattern as a mask. Therefore, the high dislocation density region A formed in the second semiconductor layer 12 is removed and the opening B is formed in the removed portion. In this case, using the difference of the concentration of n-type impurities between the first semiconductor layer 11 and the second semiconductor layer 12, the second semiconductor layer 12 may also be etched using the first semiconductor layer 11 as an etching stopper. After the completion of the etching, the resist pattern is removed.

Furthermore, in the formation of the opening B, when the depth d of the opening B is greater than the film thickness of the second semiconductor layer 12, the continuous resist pattern is subsequently used as a mask to etch the first semiconductor layer 11. In this case, the high dislocation density region A is removed such that the opening B does not reach the mask layer 23, that is, removed within a range in which the first semiconductor layer 11 is preserved on the base portion of the opening B.

FIG. 2D

Figure 2D:
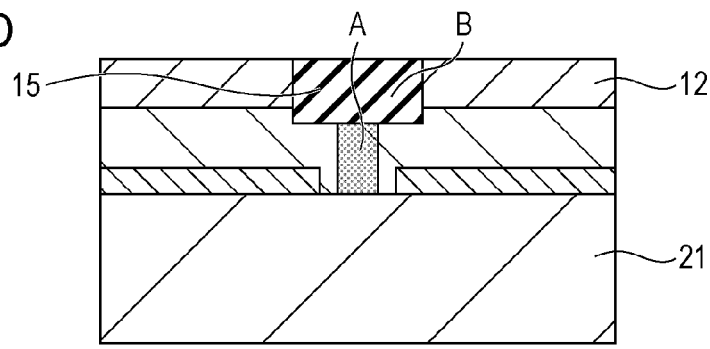

Next, as shown in FIG. 2D, the insulating film pattern 15 of a shape which covers the inner wall of the opening B is formed. In this case, first, an insulating film is formed on the supporting substrate 21 in a state of covering the second semiconductor layer 12. For example, the insulating film is formed at a film thickness sufficient to cover the inner wall of the opening B. Here, the insulating film is formed at a film thickness which fills the opening B. Subsequently, the insulating film is removed from the portions other than the opening B while preserving the insulating film within the opening B. Alternatively, a part of the insulating film is removed in order to thin the insulating film to a predetermined film thickness. The insulating film is removed by performing a full surface etch-back on the insulating film or by chemical mechanical polishing (CMP). Accordingly, the insulating film preserved within the opening B is formed as the insulating film pattern 15. The insulating film pattern 15 also covers the high dislocation density region A.

FIG. 3A

Subsequent to the processes described above, as shown in FIG. 3A, the Schottky electrode 17s is formed in a state of covering the insulating film pattern 15 and contacting the second semiconductor layer 12. Here, the Schottky electrode 17s, which is patterned in a shape corresponding to one device (diode) as necessary, is formed in a state of covering the insulating film pattern 15 and contacting the second semiconductor layer 12. The formation of the Schottky electrode 17s is performed by forming a film of the electrode material which creates a Schottky junction with the second semiconductor layer 12 above the supporting substrate 21 and subsequently pattern etching the electrode material film as necessary. In addition, in the formation of the Schottky electrode 17s, the lift-off method or the printing method may also be applied.

FIG. 3B

Figure 3A:
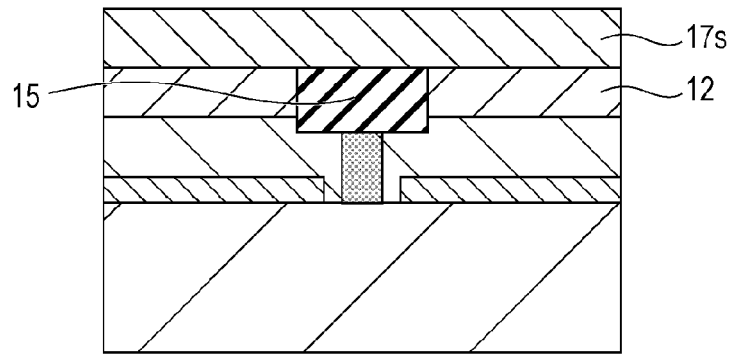
FIGS. 3A to 3C are (the second) cross-sectional process drawings showing a manufacturing process of the diode of the first embodiment.
Figure 3B:
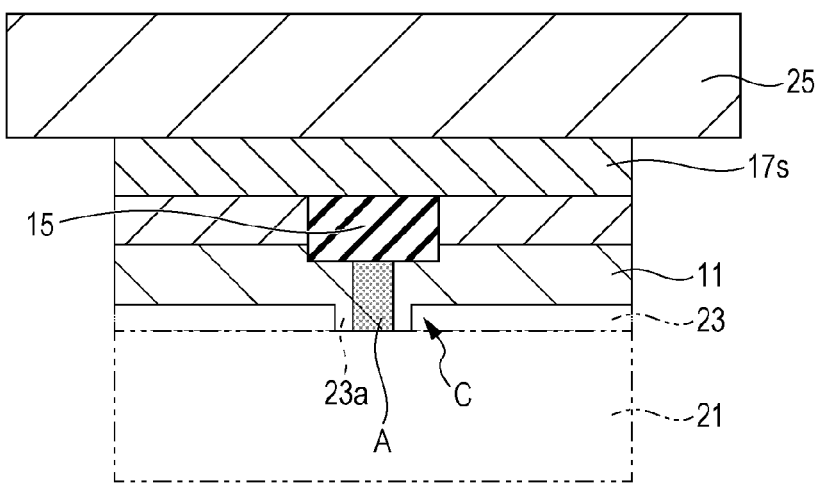

Next, as shown in FIG. 3B, a bonding substrate 25 is bonded to the Schottky electrode 17s side. Thereafter, the supporting substrate 21 is exfoliated from the first semiconductor layer 11 side, and further, the mask layer 23 is removed. Accordingly, the first semiconductor layer 11 is exposed. In this state, the high dislocation density region A of the first semiconductor layer 11 is also in an exposed state. In addition, the convex portion C which corresponds to the thickness of the mask layer 23 is formed on a portion of the first semiconductor layer 11 which corresponds to the opening portion 23a of the mask layer 23. The high dislocation density region A which penetrates the first semiconductor layer 11 is positioned in the center of the convex portion C.

FIG. 3C

Figure 3C:
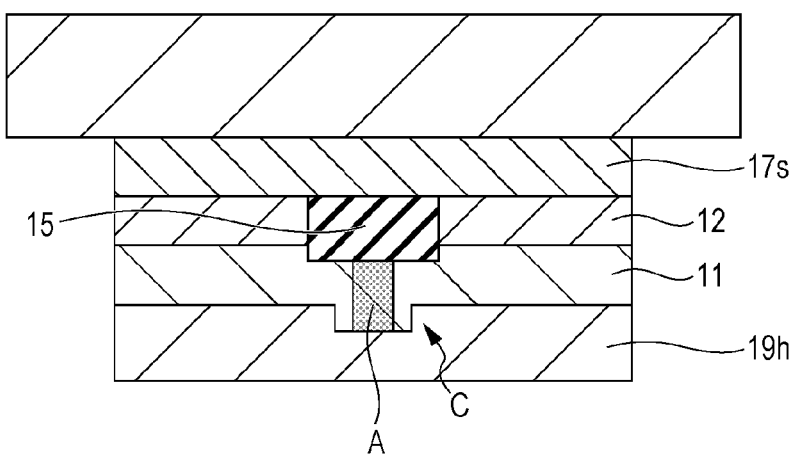

Subsequently, as shown in FIG. 3C, the ohmic electrode 19h is formed on the exposed surface of the first semiconductor layer 11 as the opposing electrode in relation to the Schottky electrode 17s. The ohmic electrode 19h is provided in a state of interposing the first semiconductor layer 11, the second semiconductor layer 12 and the insulating film pattern 15 between the Schottky electrode 17s and the ohmic electrode 19h, and is formed in a state of contacting the first semiconductor layer 11 including the high dislocation density region A. In addition, the ohmic electrode 19h covers the convex portion C of the first semiconductor layer 11, and is formed in a state of filling the convex portion C. Furthermore, the ohmic electrode 19h is patterned to a shape corresponding to one device (diode) as necessary.

The formation of the ohmic electrode 19h is performed by forming a film of the electrode material above the first semiconductor layer 11 and subsequently pattern etching the electrode material film as necessary using the resist pattern as a mask. In addition, in the formation of the ohmic electrode 19h, the lift-off method or the printing method may also be applied.

According to the above configuration, the diode 1-1 is obtained as the vertical Schottky diode described using FIG. 1.

Effects of First Embodiment

According to the diode 1-1 of the first embodiment described above, according to the presence of the insulating film pattern 15 provided within the opening B of the second semiconductor layer 12 in which the high dislocation density region A is removed, the Schottky electrode 17s is provided without making contact with the high dislocation density region A. Therefore, a vertical Schottky diode (the diode 1-1) may be provided in which a laminated body of the first semiconductor layer 11 and the second semiconductor layer 12 is interposed between the Schottky electrode 17s and the ohmic electrode 19h over a wide range including the high dislocation density region A without being influenced by the high dislocation density region A.

In addition, particularly in such a vertical Schottky diode (the diode 1-1), the opening B provided with the insulating film pattern 15 is formed in the second semiconductor layer 12 such that the first semiconductor layer 11 is in an exposed state. Therefore, the high dislocation density region A is present only in a portion of the first semiconductor layer 11, in a state of being interposed between the ohmic electrode 19h and the insulating film pattern 15. Here, the second semiconductor layer 12 in which the opening B is provided is an n-type low concentration region in which the n-type impurity concentration is lower than that of the first semiconductor layer 11 which is an n-type high concentration region. Therefore, even when a depletion layer is formed within the second semiconductor layer 12 up to the vicinity of the interface between the second semiconductor layer 12 and the first semiconductor layer 11 when applying a reverse bias between the Schottky electrode 17s and the ohmic electrode 19h during a current-off operation, the depletion layer does not reach the high dislocation density region A.

Accordingly, the occurrence of a leak current during the current-off operation can be securely prevented by a depletion layer in which voltage resistance is secured due to the absence of the high dislocation density region A.

2. Second Embodiment

Figure 4:
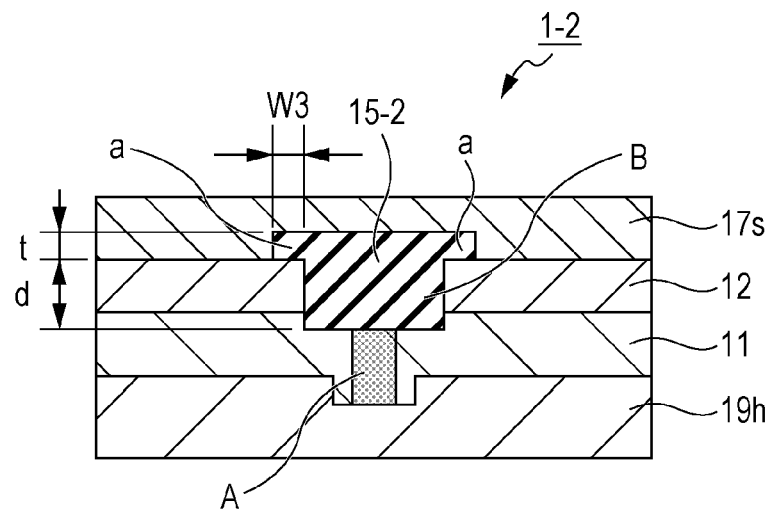
FIG. 4 is a cross-sectional view of a diode of a second embodiment.

Example which Includes Insulating Film Pattern which Projects from within Opening FIG. 4 is a cross-sectional view of the diode of the second embodiment. Below, description will be given of the configuration of the diode 1-2 of the second embodiment on the basis of this drawing.

The diode 1-2 of the second embodiment shown in FIG. 4 differs from the diode of the first embodiment described using FIG. 1 in the shape of the insulating film pattern 15-2. Since the other configurations are the same as those in the first embodiment, description of the same configurations will be omitted.

Insulating Film Pattern 15-2

The insulating film pattern 15-2 is patterned so as to project from the inner wall of the opening B to the upper portion of the second semiconductor layer 12. The insulating film pattern 15-2 is provided with a canopy portion a which projects across the entire perimeter of the peripheral side of the opening B to the upper portion of the second semiconductor layer 12. The projection width W3 of the canopy portion a from the opening B is suppressed to a degree at which a sufficient size can be secured for the Schottky junction surface between the Schottky electrode 17s and the second semiconductor layer 12. In addition, the film thickness t of the canopy portion a is of a degree at which the electric field directly beneath the canopy portion a in the second semiconductor layer 12 can be controlled by applying a voltage to the Schottky electrode 17s.

Furthermore, the insulating film pattern 15-2 has only to be provided so as to cover the inner wall of the opening B within a range of a film thickness at which insulation breakdown can be prevented when driving the diode 1-2. Therefore, the insulating film pattern 15-2 may be formed so as to completely fill the inside of the opening B, and a void may also be formed within the opening B. Furthermore, the insulating film pattern 15-2 is configured by an insulative material such as silicon oxide or silicon nitride. In addition, the insulating film pattern 15-2 is not limited to a single layer structure, and may also be a laminated structure of a plurality of laminated insulative materials. The remaining configuration is the same as in the first embodiment.

Method of Manufacturing Diode 1-2

In the method of manufacturing the diode 1-2 which includes the insulating film pattern 15-2, the insulating film pattern 15-2, which includes the canopy portion a, has only to be formed by patterning, in the forming of the insulating film pattern in the manufacturing method of the first embodiment described above. In this case, after forming the insulating film on the second semiconductor layer 12 which includes the opening B, the insulating film is pattern etched using the resist pattern as a mask, thereby forming the insulating film pattern 15-2 which is provided with the canopy portion a which projects across the entire perimeter of the peripheral side of the opening B to the upper portion of the second semiconductor layer 12.

Effects of Second Embodiment

According to the diode 1-2 of the second embodiment described above, in addition to the effects of the diode of the first embodiment, it is possible to obtain the effect caused by further providing the insulating film pattern 15-2 with the canopy portion a. In other words, in the portion provided with the canopy portion a, a field plate structure provided with the Schottky electrode 17s via the canopy portion a is formed on the second semiconductor layer 12. Therefore, when a reverse bias is applied to the Schottky electrode 17s, the vicinity of the interface region of the second semiconductor layer 12 directly beneath the canopy portion a is depleted. Therefore, the leak path which passes through the interface of the insulating film pattern 15-2 from the high dislocation density region A between the Schottky electrode 17s and the ohmic electrode 19h can be divided directly beneath the canopy portion a. Accordingly, the effect of preventing the occurrence of a leak current during the current-off operation is greater than that of the first embodiment.

3. Third Embodiment

Example in which Electrodes are Proximal

Figure 5:
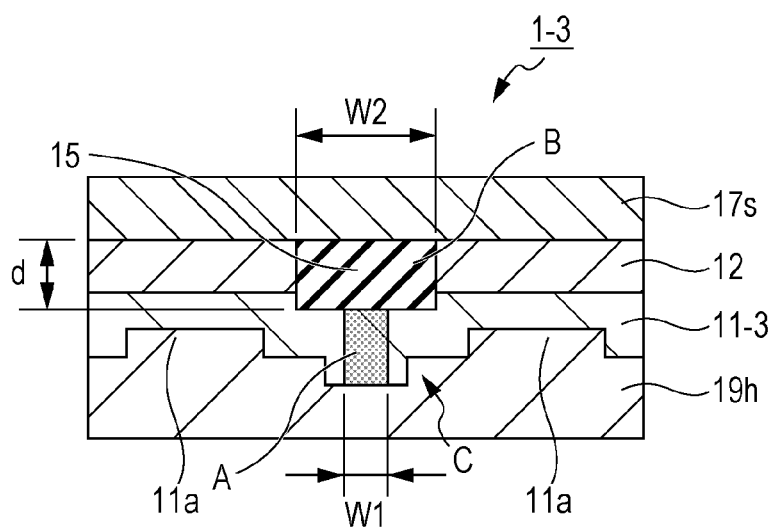
FIG. 5 is a cross-sectional view of a diode of a third embodiment.

FIG. 5 is a cross-sectional view of the diode of the third embodiment. Below, description will be given of the configuration of the diode 1-3 of the third embodiment on the basis of this drawing.

The diode 1-3 of the third embodiment shown in FIG. 5 differs from the diode of the first embodiment described using FIG. 1 in that the first semiconductor layer 11-3 includes a concave portion 11a. Since the other configurations are the same as those in the first embodiment, description of the same configurations will be omitted.

First Semiconductor Layer 11-3

The first semiconductor layer 11-3 includes the concave portion 11a which is formed on the surface layer of the ohmic electrode 19h side. The concave portion 11a is provided beside the high dislocation density region A in the first semiconductor layer 11-3. The concave portion 11a is formed in order to partially bring the Schottky electrode 17s and the ohmic electrode 19h into proximity by decreasing the interval therebetween by partially thinning the film of the first semiconductor layer 11-3.

Therefore, the concave portion 11a is provided beside the high dislocation density region A. In addition, when the convex portion C described in the first embodiment is formed on the first semiconductor layer 11, the concave portion 11a is provided beside the convex portion C. Furthermore, the concave portion 11a is provided at a depth and position so as not to reach the opening B. Therefore, it is preferable that the concave portion 11a be provided beside the opening B without overlapping the opening B.

It is preferable that the concave portion 11a be provided across as wide a range as possible, within a range so as not to reach the high dislocation density region A in the first semiconductor layer 11-3. Accordingly, in the example illustrated, a thick film portion, in which the concave portion 11a is not formed, is preserved in the peripheral edge of the first semiconductor layer 11-3. However, the peripheral edge of the first semiconductor layer 11-3 may also be subjected to film thinning and treated as the concave portion 11a.

Furthermore, the ohmic electrode 19h which is provided so as to contact the first semiconductor layer 11-3 which includes the concave portion 11a is provided within the concave portion 11a from the upper portion of the first semiconductor layer 11-3 including the high dislocation density region A, and is provided so as to widely contact the first semiconductor layer 11-3.

Method of Manufacturing Diode 1-3

Figure 6A:
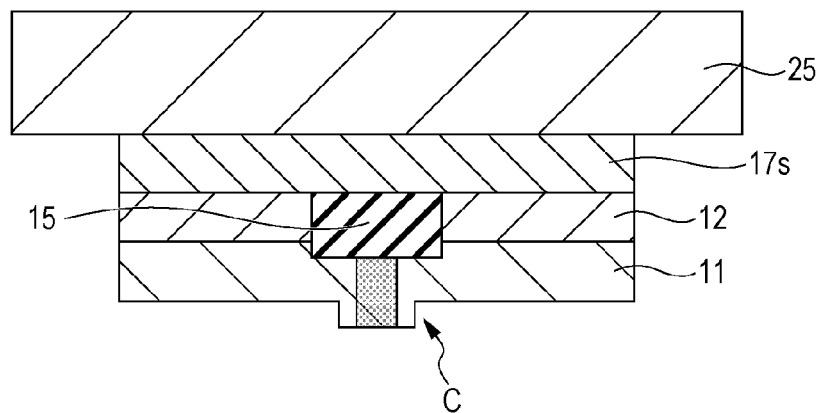
FIGS. 6A to 6C are cross-sectional process drawings showing a manufacturing process of the diode of the third embodiment.
Figure 6B:
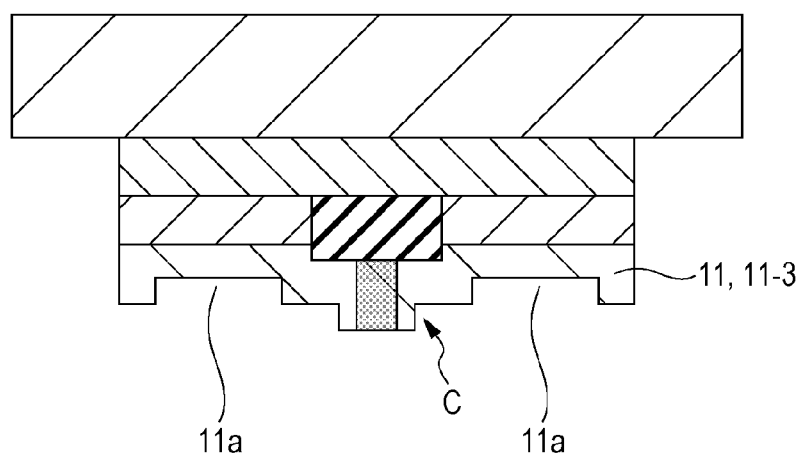
Figure 6C:
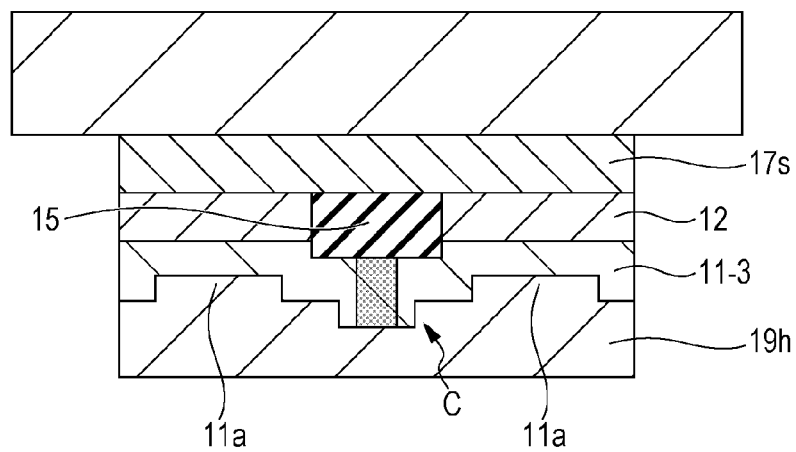

FIGS. 6A to 6C are cross-sectional process drawings showing the characteristic portions of the method of manufacturing the diode 1-3 of the configuration described above. Next, description will be given of the manufacturing process of the characteristic portions of the manufacturing method of the third embodiment on the basis of the drawings.

First, by performing the same procedure as described using FIG. 2A in the first embodiment before the manufacturing process of the characteristic portions of the third embodiment, the mask layer 23 is formed on the supporting substrate 21 which has a crystalline structure. However, in the mask layer 23, an opening pattern for positioning, which is omitted from the drawings, is formed in a position which is not influenced by the formation of the device at the same time as the opening portion 23a is formed in a position corresponding to the portion at which the device is formed.

Subsequently, the same procedures are performed as described using FIGS. 2B to 2D, 3A and 3B in the first embodiment.

FIG. 6A

As shown in FIG. 6A, a state is obtained in which the first semiconductor layer 11, the second semiconductor layer 12, the insulating film pattern 15 and the Schottky electrode 17s are formed, and the bonding substrate 25 is bonded to the Schottky electrode 17s side. Furthermore, the supporting substrate and the mask layer which are omitted from the drawings are removed from the first semiconductor layer 11 side, and the first semiconductor layer 11 is in an exposed state. In this state, in the same manner as described earlier in the first embodiment, the convex portion C which corresponds to the opening portion of the mask layer described above is formed on the exposed surface side of the first semiconductor layer 11. In addition, particularly in the procedure of the third embodiment, a state is obtained in which a convex-shaped positioning pattern (not shown) is also formed in a position which corresponds to the opening pattern for positioning of the mask layer described above.

FIG. 6B

In this state, subsequently, as shown in FIG. 6B, the concave portion 11a is formed on the exposed surface side of the first semiconductor layer 11. In this case, first, lithography is performed using the convex-shaped positioning pattern (not shown), which is formed in the same process as the convex portion C, as the positioning marker. Accordingly, the resist pattern which has an opening is formed on the upper portion of the exposed surface of the first semiconductor layer 11. In addition, the opening is formed in a position beside the high dislocation density region A and the convex portion C, more preferably, in a position which does not overlap the opening B. Next, the concave portion 11a is formed in the first semiconductor layer 11 by etching the first semiconductor layer 11 using the resist pattern as a mask. In this case, in the base portion of the concave portion 11a, the etching time is controlled such that the first semiconductor layer 11 is not completely removed in the depth direction.

According to the above, in relation to the first semiconductor layer 11, the first semiconductor layer 11-3 provided with the concave portion 11a of the opposite side to the Schottky electrode 17s is formed. Furthermore, after the completion of the etching, the resist pattern is removed. FIG. 6C Next, as shown in FIG. 6C, the ohmic electrode 19h is formed on the surface on which the concave portion 11a is formed in the first semiconductor layer 11-3. The ohmic electrode 19h is provided in a state of interposing the first semiconductor layer 11-3, the second semiconductor layer 12 and the insulating film pattern 15 between the Schottky electrode 17s and the ohmic electrode 19h, and is formed in a state of contacting the first semiconductor layer 11 including the high dislocation density region A. In addition, the ohmic electrode 19h covers the convex portion C of the first semiconductor layer 11, and is formed in a state of filling the convex portion C and the concave portion 11a. Furthermore, the ohmic electrode 19h is patterned to a shape corresponding to one device (diode) as necessary.

The formation of the ohmic electrode 19h is performed by forming a film of the electrode material above the first semiconductor layer 11-3 and subsequently pattern etching the electrode material film as necessary using the resist pattern as a mask. In addition, in the formation of the ohmic electrode 19h, the lift-off method or the printing method may also be applied. When forming the ohmic electrode 19h using patterning, the convex-shaped positioning pattern (not shown), which is formed on the first semiconductor layer 11-3, is used as an alignment marker, in the same manner as the formation of the concave portion 11a.

According to the above configuration, the diode 1-3 is obtained as the vertical Schottky diode described using FIG. 5.

Effects of Third Embodiment

According to the diode 1-3 of the third embodiment described above, in addition to the effects of the diode of the first embodiment, it is possible to obtain the effect caused by further providing the first semiconductor layer 11-3 with the concave portion 11a. In other words, the first semiconductor layer 11-3 is of a configuration in which the concave portion 11a is provided beside the high dislocation density region A which penetrates the first semiconductor layer 11-3. Therefore, it is possible to dispose the ohmic electrode 19h close to the Schottky electrode 17s in a portion of the first semiconductor layer 11-3 which has a favorable crystalline state. Therefore, a current flows between the ohmic electrode 19h and the Schottky electrode 17s, concentrated on a position in which the distance between the electrodes is short and the crystalline state in the first semiconductor layer 11-3 is favorable. Therefore, it is possible to perform driving in which the influence of the high dislocation density region A is suppressed more.

Furthermore, according to the manufacturing method of the third embodiment, when forming the concave portion 11a on the exposed surface side of the first semiconductor layer 11-3, it is possible to use the convex-shaped positioning pattern which is formed on the exposed surface side of the first semiconductor layer 11-3 as an alignment marker. Similarly, when forming the ohmic electrode 19h which contacts the exposed surface side of the first semiconductor layer 11-3 using patterning, it is also possible to use the convex-shaped positioning pattern which is formed on the exposed surface side of the first semiconductor layer 11-3 as an alignment marker. Therefore, it is possible to manufacture the diode 1-3 using only ordinary lithography processes without performing any exceptional lithography processes which use a specialized apparatus such as a back-side aligner.

Furthermore, it is possible to combine the configuration of the third embodiment with the configuration of the second embodiment described above, and the insulating film pattern may also be of a shape which projects from the upper portion of the second semiconductor layer 12. Accordingly, it is possible to realize the effects of the second embodiment.

4. Fourth Embodiment

Figure 7:
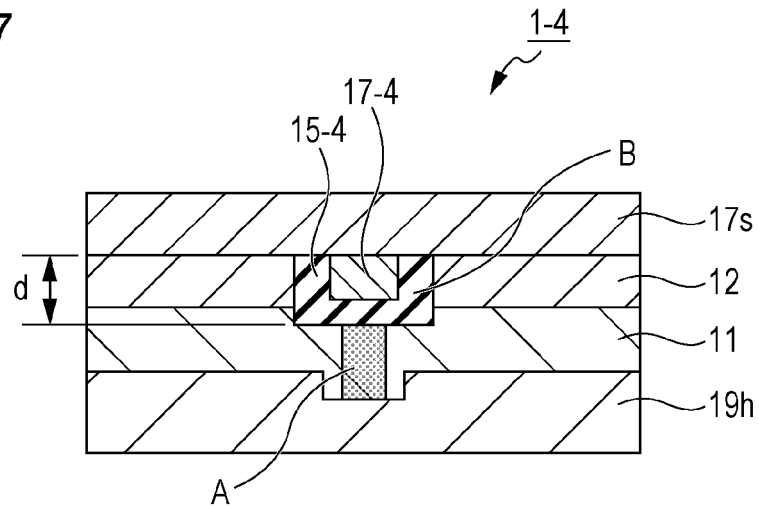
FIG. 7 is a cross-sectional view of a diode of a fourth embodiment.

Example in which Embedded Electrode is Provided within Opening Via Insulating Film Pattern FIG. 7 is a cross-sectional view of the diode of the fourth embodiment. Below, description will be given of the configuration of the diode 1-4 of the fourth embodiment on the basis of this drawing.

The diode 1-4 of the fourth embodiment shown in FIG. 7 differs from the diode of the first embodiment described using FIG. 1 in that the shape of the insulating film pattern 15-4 is different and in that the diode 1-4 includes an embedded electrode 17-4 which is connected to the Schottky electrode 17s. Since the other configurations are the same as those in the first embodiment, description of the same configurations will be omitted.

Insulating Film Pattern 15-4

The insulating film pattern 15-4 is provided along the inner wall of the opening B so as to cover the inner wall, at a film thickness which does not completely fill the inside of the opening B. However, in the same manner as in the first embodiment, the insulating film pattern 15-4 is of a film thickness within a range at which insulation breakdown can be prevented when driving the diode 1-4. In addition, the insulating film pattern 15-4 is configured by an insulative material such as silicon oxide or silicon nitride. In addition, the insulating film pattern 15-4 is not limited to a single layer structure, and may also be a laminated structure of a plurality of laminated insulative materials. This is also the same as in the first embodiment.

Furthermore, the film thickness of the insulating film pattern 15-4 is of a degree at which the field plate effect, caused by the Schottky electrode 17s or the embedded electrode 17-4, can be obtained in the first semiconductor layer 11 and the second semiconductor layer 12 by applying a voltage to the embedded electrode 17-4, and at which the insulating film pattern 15-4 does not cause insulation breakdown.

Embedded Electrode 17-4

The embedded electrode 17-4 is embedded in the inner portion of the opening B via the insulating film pattern 15-4, and is provided in a state of being connected to the Schottky electrode 17s which covers the insulating film pattern 15-4. The embedded electrode 17-4 has only to be configured using a conductive material, and examples of the conductive material include nickel (Ni), gold (Au) and polysilicon. In addition, the embedded electrode 17-4 may also be formed as a part continuing from the Schottky electrode 17s.

Method of Manufacturing Diode 1-4

In the method of manufacturing the diode 1-4, in the forming of the insulating film pattern in the manufacturing method of the first embodiment described above, after forming a film of the insulating film along the inner wall of the opening B at a film thickness at which the opening B is not filled, the embedded electrode material may be formed as a film in a state of filling the opening B. Subsequently, the insulating film and the embedded electrode material of the upper portion of the second semiconductor layer 12 are removed so as to preserve the insulating film and the embedded electrode material within the opening B. Accordingly, the insulating film preserved within the opening B is formed as the insulating film pattern 15-4. Furthermore, the embedded electrode material preserved within the opening B is formed as the embedded electrode 17-4 via the insulating film pattern 15-4.

Effects of Fourth Embodiment

According to the diode 1-4 of the fourth embodiment described above, in addition to the effects of the diode of the first embodiment, it is possible to obtain the effect caused by further providing the embedded electrode 17-4, which is connected to the Schottky electrode 17s, within the opening B. In other words, by providing the embedded electrode 17-4 within the opening B, a depletion layer is formed within the second semiconductor layer 12 up to the vicinity of the interface between the second semiconductor layer 12 and the first semiconductor layer 11 when applying a reverse bias to the Schottky electrode 17s during the current-off operation. In addition, during the current-off operation, a depletion layer is also formed in a position along the interface of the first semiconductor layer 11 and the second semiconductor layer 12 which are in contact with the insulating film pattern 15-4.

Here, in comparison with a general silicon semiconductor, it is difficult to form a favorable interface between the semiconductor and the insulator when using a compound semiconductor. Therefore, there is a case in which a leak path is generated in the interface of the first semiconductor layer 11 and the second semiconductor layer 12 which are in contact with the insulating film pattern 15-4 which is provided to cover the inner wall of the opening B. However, according to the configuration of the fourth embodiment, during the application of a reverse bias (during the current-off operation), most portions of the leak path, which passes through the interface of the insulating film pattern 15-4 from the high dislocation density region A between the Schottky electrode 17s and the ohmic electrode 19h, can be divided by the depletion layer formed along the interface of the first semiconductor layer 11 and the second semiconductor layer 12. Accordingly, the occurrence of a leak current can be prevented more securely than in the first embodiment.

Furthermore, it is possible to combine the configuration of the fourth embodiment with each of the configurations of the second embodiment and the third embodiment described above. For example, the configuration of the forth embodiment may be combined with the configuration of the second embodiment described above using FIG. 4, and the insulating film pattern 15-4 may also be of a shape which projects from the upper portion of the second semiconductor layer 12. Furthermore, the configuration of the forth embodiment may be combined with the configuration of the third embodiment described using FIG. 5, and a concave portion may also be provided on the ohmic electrode 19h side of the first semiconductor layer 11. Furthermore, the configuration of the fourth embodiment may also include both configurations of the second embodiment and the third embodiment. In this manner, by combining the configuration of the fourth embodiment with each of the configurations of the second embodiment and the third embodiment, it is possible to realize the effects of each of the embodiments.

5. Fifth Embodiment

Figure 8:
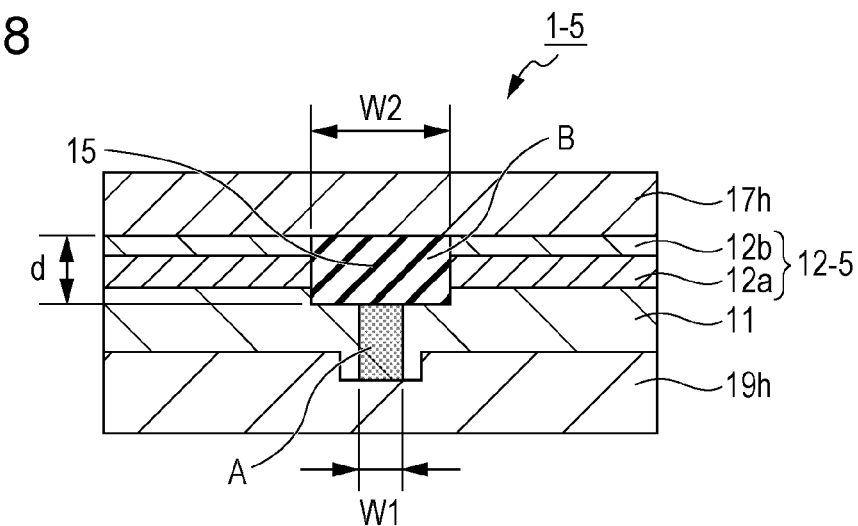
FIG. 8 is a cross-sectional view of a diode of a fifth embodiment.

Example of pn-Junction Diode in which Insulating Film Pattern is Provided within Opening FIG. 8 is a cross-sectional view of the diode of the fifth embodiment. Below, description will be given of the configuration of the diode 1-5 of the fifth embodiment on the basis of this drawing.

The diode 1-5 of the fifth embodiment shown in FIG. 8 differs from the diode of the first embodiment described using FIG. 1 in that the second semiconductor layer 12-5 is configured by laminating semiconductor layers of two differing conductivity types. In addition, an ohmic electrode 17h is connected to the second semiconductor layer 12-5 as the electrode which retrieves an electric potential of the second semiconductor layer 12-5. Since the other configurations are the same as those in the first embodiment, description of the same configurations will be omitted.

Second Semiconductor Layer 12-5

The second semiconductor layer 12-5 is a laminated structure of a low concentration semiconductor layer 12a of the first semiconductor layer 11 side, and an opposite conductivity type semiconductor layer 12b of a second conductivity type provided on the ohmic electrode 17h side. The low concentration semiconductor layer 12a and the opposite conductivity type semiconductor layer 12b are configured by a compound semiconductor which has a crystalline structure which is continuous from the first semiconductor layer 11.

Of these, the low concentration semiconductor layer 12a is of the first conductivity type, the same as the first semiconductor layer 11, which is n-type here. The low concentration semiconductor layer 12a has a lower n-type impurity concentration than the first semiconductor layer 11. Meanwhile, the opposite conductivity type semiconductor layer 12b is of the opposite conductivity type to the first semiconductor layer 11, which is p-type here. When the opposite conductivity type semiconductor layer 12b is a group III-V nitride semiconductor, magnesium (Mg) or the like is used as the p-type impurity.

Ohmic Electrode 17h

The ohmic electrode 17h is provided so as to cover the insulating film pattern 15 and to contact the opposite conductivity type semiconductor layer 12b of the second semiconductor layer 12-5. The ohmic electrode 17h is provided as an electrode which retrieves an electric potential of the opposite conductivity type semiconductor layer 12b within the second semiconductor layer 12-5. For example, the ohmic electrode 17h is configured by a material which forms an ohmic junction with the opposite conductivity type semiconductor layer 12b.

As described above, the vertical pn-junction diode is configured by joining the ohmic electrode 17h to the p-type opposite conductivity type semiconductor layer 12b, and joining the ohmic electrode 19h to the first semiconductor layer 11 which is configured as the n-type high concentration region. Furthermore, here, the electrode provided so as to contact the opposite conductivity type semiconductor layer 12b is the ohmic electrode 17h. However, the ohmic electrode 17h has only to be provided as an electrode which retrieves an electric potential of the opposite conductivity type semiconductor layer 12b, and it is not necessary that the ohmic electrode 17h form an ohmic junction with the opposite conductivity type semiconductor layer 12b.

Method of Manufacturing Diode 1-5

In the method of manufacturing the diode 1-5 described above, in the forming of the second semiconductor layer in the manufacturing method of the first embodiment described above, the low concentration semiconductor layer 12a and the opposite conductivity type semiconductor layer 12b may be formed in this order. In this case, first, the n-type low concentration semiconductor layer 12a is epitaxially grown on the upper portion of the n-type first semiconductor layer 11 so as to inherit the crystalline properties of the first semiconductor layer 11, and subsequently, the p-type opposite conductivity type semiconductor layer 12b is epitaxially grown.

Effects of Fifth Embodiment

Even in the diode 1-5 of the fifth embodiment described above, according to the presence of the insulating film pattern 15 provided within the opening B of the second semiconductor layer 12-5 in which the high dislocation density region A is removed, the ohmic electrode 17h is provided without making contact with the high dislocation density region A. Therefore, it is possible to provide a vertical pn-junction diode (the diode 1-5) in which a laminated body of the first semiconductor layer 11 and the second semiconductor layer 12, which are configured by a compound semiconductor, is interposed between the ohmic electrode 17h and the ohmic electrode 19h over a wide range including the high dislocation density region A.

In addition, particularly in such a vertical pn-junction diode (the diode 1-5), the opening B provided with the insulating film pattern 15 is formed in the second semiconductor layer 12-5 such that the first semiconductor layer 11 is in an exposed state. Therefore, the high dislocation density region A is present only in a portion of the first semiconductor layer 11, in a state of being interposed between the ohmic electrode 19h and the insulating film pattern 15. Here, the interface region of the first semiconductor layer 11 side of the second semiconductor layer 12-5 in which the opening B is provided is the low concentration semiconductor layer 12a in which the n-type impurity concentration is lower than that of the first semiconductor layer 11 which is an n-type high concentration region. Therefore, even when a depletion layer is formed within the second semiconductor layer 12-5 up to the vicinity of the interface between the second semiconductor layer 12-5 and the first semiconductor layer 11 when applying a reverse bias between the ohmic electrode 17h and the ohmic electrode 19h during the current-off operation, the depletion layer does not reach the high dislocation density region A. Accordingly, in the same manner as described in the other embodiments, the occurrence of a leak current during a current-off operation can be securely prevented by a depletion layer in which voltage resistance is secured due to the absence of the high dislocation density region A.

Furthermore, it is possible to combine the configuration of the fifth embodiment with each of the configurations of the second embodiment to the fourth embodiment described above. For example, the configuration of the fifth embodiment may also be combined with the configuration of the second embodiment described using FIG. 4, and the insulating film pattern 15 may also be of a shape which projects from the upper portion of the second semiconductor layer 12-5. Furthermore, the configuration of the fifth embodiment may be combined with the configuration of the third embodiment described using FIG. 5, and a concave portion may also be provided on the ohmic electrode 19h side of the first semiconductor layer 11. Furthermore, the configuration of the fifth embodiment may be combined with the configuration of the fourth embodiment described using FIG. 7, and the embedded electrode connected to the ohmic electrode 17h may also be configured to fill the inner portion of the opening B via the insulating film pattern.

By combining the configuration of the fifth embodiment with each of the configurations of the second embodiment to the fourth embodiment, it is possible to realize the effects of each of the embodiments.

6. Sixth Embodiment

Figure 9:
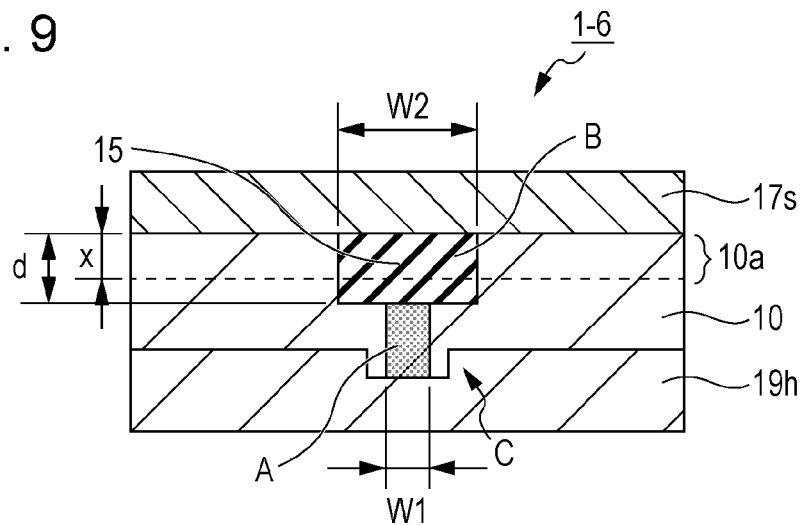
FIG. 9 is a cross-sectional view of a diode of a sixth embodiment.

Another Example of Schottky Diode in which Insulating Film Pattern is Provided within Opening FIG. 9 is a cross-sectional view of the diode of the sixth embodiment. Below, description will be given of the configuration of the diode 1-6 of the sixth embodiment on the basis of this drawing.

The diode 1-6 of the sixth embodiment shown in FIG. 9 differs from the diode of the first embodiment described using FIG. 1 in that one layer of a semiconductor layer 10 is interposed between the Schottky electrode 17s and the ohmic electrode 19h. Below, configuration elements which are the same as those in the first embodiment are given the same reference numerals, and descriptions of the same configurations will be omitted.

In other words, the diode 1-6 of the sixth embodiment is a vertical Schottky diode which uses a compound semiconductor. The diode 1-6 has a vertical device structure, through which a current flows in the thickness direction, including a semiconductor layer 10, a Schottky electrode 17s disposed so as to interpose the semiconductor layer 10, and an ohmic electrode 19h as the opposing electrode corresponding to the Schottky electrode 17s. An opening B is provided in the semiconductor layer 10, and the insulating film pattern 15 is provided in a state of covering an inner wall of the opening B.

Below detailed description will be given of the configuration of the diode 1-6 according to the sixth embodiment in the order of the semiconductor layer 10, the opening B, the insulating film pattern 15, the Schottky electrode 17s and the ohmic electrode 19h. Subsequently, description will be given of the method of manufacturing the diode 1-6.

Semiconductor Layer 10

The semiconductor layer 10 is the same as the first semiconductor layer in the other embodiments, and is configured by a compound semiconductor (for example, a group III-V nitride semiconductor) of a crystalline structure formed by epitaxial growth using the ELO (epitaxial lateral overgrowth) method, for example. Therefore, the semiconductor layer 10 includes a convex portion C which corresponds to the initiation portion of the epitaxial growth, and the high dislocation density region A is generated to penetrate the layer in the vicinity of the center of the convex portion C.

Opening B

The opening B is formed on the semiconductor layer 10 and is provided in a state in which a portion corresponding to the high dislocation density region A is removed. The opening B is provided in a portion which overlaps the high dislocation density region A in the semiconductor layer 10.

In addition, the opening B is provided in a state of completely covering the high dislocation density region A. Therefore, when the width of the high dislocation density region A is W1, the width W2 of the opening B is W2>W1, and the opening B is formed in a state of completely covering the high dislocation density region A when viewed in a planar manner. Furthermore, the size of the opening B when viewed in a planar manner may also be of a size which covers the convex portion C of the semiconductor layer 10, and may also be of a size within that of the convex portion C. In addition, the opening B is provided without penetrating the semiconductor layer 10.

Insulating Film Pattern 15

The insulating film pattern 15 is the same as in the other embodiments, and is provided in a state of covering an inner wall including a base portion of the opening B.

Schottky Electrode 17s

The Schottky electrode 17s is the same as in the other embodiments, and is provided so as to cover the insulating film pattern 15 and to contact the semiconductor layer 10. However, the Schottky electrode 17s applies a voltage to the semiconductor layer 10 so as to form a depletion layer 10a which is shallower than the opening B.

Ohmic Electrode 19h

The ohmic electrode 19h is the same as in the other embodiments. However, the ohmic electrode 19h and the Schottky electrode 17s apply a voltage to the semiconductor layer 10 so as to form a depletion layer 10a which is shallower than the opening B.

As described above, the diode 1-6 is configured as a vertical Schottky diode in which the semiconductor layer 10 configured as an n-type region is interposed between the Schottky electrode 17s and the ohmic electrode 19h.

Method of Manufacturing Diode 1-6

In the method of manufacturing the diode 1-6 described above, in the forming of the first semiconductor layer and the second semiconductor layer by epitaxial growth in the manufacturing method of the first embodiment described above, the forming of the second semiconductor layer may be omitted. Furthermore, the first semiconductor layer may be epitaxially grown as the semiconductor layer 10, and the other processes are the same as in the first embodiment. However, when forming the opening B, in consideration of a depth x of the depletion layer 10a which is formed on the semiconductor layer 10 by the driving of the diode 1-6, the opening B is formed at a depth d which is greater than the depth x.

Effects of Sixth Embodiment

According to the diode 1-6 of the sixth embodiment described above, according to the presence of the insulating film pattern 15 provided within the opening B of semiconductor layer 10 in which the high dislocation density region A is removed, the Schottky electrode 17s is provided without making contact with the high dislocation density region A. Therefore, it is possible to provide a vertical Schottky diode (the diode 1-6) in which the semiconductor layer 10 which is configured by a compound semiconductor is interposed between the Schottky electrode 17s and the ohmic electrode 19h over a wide range including the high dislocation density region A.

In addition, particularly in such a vertical Schottky diode (the diode 1-6), the opening B provided with the insulating film pattern 15 is of a depth d which surpasses the depletion layer 10a which is generated within the semiconductor layer 10 due to the application of a voltage between the Schottky electrode 17s and the ohmic electrode 19h. Therefore, during the current-off operation, the depletion layer 10a does not reach the high dislocation density region A. Accordingly, in the same manner as described in the other embodiments, the occurrence of a leak current during a current-off operation can be securely prevented by a depletion layer in which voltage resistance is secured due to the absence of the high dislocation density region A.

Furthermore, it is possible to combine the configuration of the sixth embodiment with each of the configurations of the second embodiment to the fourth embodiment described above. For example, the configuration of the sixth embodiment may be combined with the configuration of the second embodiment described above using FIG. 4, and the insulating film pattern 15 may also be of a shape which projects from the upper portion of the semiconductor layer 10. Furthermore, the configuration of the sixth embodiment may be combined with the configuration of the third embodiment described using FIG. 5, and a concave portion may also be provided on the ohmic electrode 19h side of the semiconductor layer 10. In this case, the depth of the concave portion is of a depth which does not reach the depletion layer 10a which is formed in the semiconductor layer 10. Furthermore, the configuration of the sixth embodiment may be combined with the configuration of the fourth embodiment described using FIG. 7, and the embedded electrode connected to the Schottky electrode 17s may also be configured to fill the inner portion of the opening B via the insulating film pattern 15.

By combining the configuration of the sixth embodiment with each of the configurations of the second embodiment to the fourth embodiment, it is possible to realize the effects of each of the embodiments.

Furthermore, the present disclosure may adopt configurations such as the following.

(1) A diode including a first semiconductor layer configured by a compound semiconductor containing impurities of a first conductivity type; a high dislocation density region which penetrates the first semiconductor layer in the film thickness direction; a second semiconductor layer which has a crystalline structure continuous with the first semiconductor layer, which is laminated on the first semiconductor layer, which is lower in a concentration of the impurities in a region of a side of an interface with the first semiconductor layer than that of the first semiconductor layer, and which has an opening in which a portion which corresponds to the high dislocation density region is removed such that the first semiconductor layer is in an exposed state; an insulating film pattern which is provided in a state of covering an inner wall including a base portion of the opening; an electrode which is provided so as to cover the insulating film pattern and to contact the second semiconductor layer; and an opposing electrode which is provided in a state of interposing the first semiconductor layer, the second semiconductor layer and the insulating film pattern between the electrode and the opposing electrode so as to contact the first semiconductor layer including the high dislocation density region.

(2) The diode according to (1), in which the opening provided in the second semiconductor layer is formed deeper than the film thickness of the second semiconductor layer.

(3) The diode according to (1) or (2), in which the insulating film pattern is provided so as to project from the inner wall of the opening to an upper portion of the second semiconductor layer.

(4) The diode according to any one of (1) to (3), in which the first semiconductor layer includes a concave portion beside the high dislocation density region on the opposing electrode side; and the opposing electrode is provided from an upper portion of the first semiconductor layer to within the concave portion.

(5) The diode according to any one of (1) to (4), in which, within the opening, there is provided an embedded electrode which is connected to the electrode and is embedded in an inner portion of the opening via the insulating film pattern.

(6) The diode according to any one of (1) to (5), in which the opening is formed at a width to completely cover the high dislocation density region.

(7) The diode according to any one of (1) to (6), in which the second semiconductor layer is configured as a low concentration region, the entire region of which has lower concentration of impurities of the first conductivity type than that of the first semiconductor layer.

(8) The diode according to any one of (1) to (7), in which the electrode is provided as a Schottky electrode in relation to the second semiconductor layer, and the opposing electrode is provided as an electrode which retrieves an electric potential of the first semiconductor layer.

(9) The diode according to any one of (1) to (6), in which the second semiconductor layer is a laminated structure of a low concentration semiconductor layer of a first conductivity type provided on the first semiconductor layer side, and an opposite conductivity type semiconductor layer of a second conductivity type provided on the electrode side.

(10) The diode according to (9), in which the electrode is provided as an electrode which retrieves an electric potential of the opposite conductivity type semiconductor layer in the second semiconductor layer, and the opposing electrode is provided as an electrode which retrieves an electric potential of the first semiconductor layer.

(11) The diode according to any one of (1) to (10), in which the first semiconductor layer and the second semiconductor layer are configured by a group III-V nitride semiconductor.

(12) The diode according to any one of (1) to (10), in which the first semiconductor layer and the second semiconductor layer are configured by one of gallium nitride (GaN), indium gallium nitride ($In_xGa_{1-x}N$: $0<x\le1$) and aluminum gallium nitride ($Al_xGa_{1-x}N$: $0<x\le1$).

(13) A diode including a semiconductor layer which is configured by a compound semiconductor of a crystalline structure, includes a high dislocation density region which penetrates the layer in a film thickness direction, and includes an opening, in which the high dislocation density region is removed, on a primary surface side; an insulating film pattern which is provided in a state of covering an inner wall including a base portion of the opening; an insulating film pattern which is provided in a state of covering an inner wall including a base portion of the opening; an electrode which is provided so as to cover the insulating film pattern and to contact the semiconductor layer; and an opposing electrode which is provided in a state of interposing the semiconductor layer and the insulating film pattern between the electrode and the opposing electrode so as to contact the semiconductor layer including the high dislocation density region, to which, and to the electrode, a voltage is applied to form a depletion layer shallower than the opening in the semiconductor layer.

(14) A method of manufacturing a diode including forming a mask layer which includes an opening portion on a supporting substrate; forming a first semiconductor layer which includes a high dislocation density region, which penetrates in a film thickness direction, to correspond to the opening portion and is configured by a compound semiconductor of a crystalline structure containing impurities of a first conductivity type by inducing epitaxial growth from an exposed surface of the supporting substrate to above the mask layer in the opening portion; forming a second semiconductor layer in which a concentration of the impurities in a region of a side of an interface with the first semiconductor layer is lower than that of the first semiconductor layer by using epitaxial growth which is continuous from the first semiconductor layer; forming, in the second semiconductor layer, an opening in which a portion which corresponds to the high dislocation density region is removed such that the first semiconductor layer is in an exposed state; forming an insulating film pattern which is in a state of covering an inner wall including a base portion of the opening; forming an electrode which covers the insulating film pattern and contacts the second semiconductor layer; removing the supporting substrate and the mask layer from the first semiconductor layer; forming an opposing electrode which is in a state of interposing the first semiconductor layer, the second semiconductor layer and the insulating film pattern between the electrode and the opposing electrode so as to contact the first semiconductor layer including the high dislocation density region.

(15) The method of manufacturing a diode according to (14), in which, in the forming of the opening, the opening is formed deeper than the second semiconductor layer.

(16) The method of manufacturing a diode according to (14) or (15), in which, in the forming of the insulating film pattern, the insulating film pattern is formed in a state of projecting from an inner wall of the opening to an upper portion of the second semiconductor layer.

(17) The method of manufacturing a diode according to any one of (14) to (16), in which after removing the supporting substrate and the mask layer from the first semiconductor layer, forming a concave portion beside the high dislocation density region in the first semiconductor layer is performed, and in the forming of the opposing electrode, the opposing electrode is formed from an upper portion of the first semiconductor layer to within the concave portion.

(18) The method of manufacturing a diode according to (17), in which, in the forming of the mask layer, an opening pattern for positioning is formed in addition to the opening portion in the mask layer; in the forming of the first semiconductor layer, the supporting substrate is epitaxially grown from an exposed surface to above the mask layer in the opening portion and the opening pattern, and in the forming of the concave portion, a convex portion of the first semiconductor layer formed in a formation position of the opening pattern is used as a positioning marker.

The present disclosure contains subject matter related to that disclosed in Japanese Priority Patent Application JP 2012-191476 filed in the Japan Patent Office on Aug. 31, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A diode comprising:
   a first semiconductor layer is a compound semiconductor layer having a crystalline structure and containing impurities of a first conductivity type;
   a high dislocation density region which extends in the first semiconductor layer in the film thickness direction;
   a second semiconductor layer which (a) has a crystalline structure continuous with that of the first semiconductor layer, (b) is laminated on a first side of the first semiconductor layer, (c) has a region at a side adjacent the first semiconductor layer with an impurity concentration lower that of the first semiconductor layer, and (d) has an opening which overlies the high dislocation density region and which extends to the first semiconductor layer;
   an insulating film pattern covering at least an inner wall of the opening;
   an electrode overlapping the opening and covering the insulating film pattern and in contact with the second semiconductor layer; and
   an opposing electrode adjacent a second side of the first semiconductor layer and in contact with the first semiconductor layer including the high dislocation density region.

2. The diode according to claim 1, wherein the opening extends into the first semiconductor layer.

3. The diode according to claim 1, wherein the insulating film pattern includes a canopy portion with a flange portion extending outside of the opening and beyond a diameter of the opening.

4. The diode according to claim 1, wherein:
   the first semiconductor layer includes a concave portion at the second side of the first semiconductor layer at a location other than the high dislocation density region, and
   the opposing electrode extends into the concave portion.

5. The diode according to claim 1, wherein, within the opening, there is provided an embedded electrode which is connected to the electrode and is embedded in an inner portion of the opening via the insulating film pattern.

6. The diode according to claim 1, wherein the opening is formed at a width to completely cover the high dislocation density region.

7. The diode according to claim 1, wherein the second semiconductor layer is a low impurity concentration region of the first semiconductor layer.

8. The diode according to claim 1, wherein:
   the electrode is a Schottky electrode in relation to the second semiconductor layer, and
   the opposing electrode is an electrode via which an electric potential of the first semiconductor layer can be retrieved.

9. The diode according to claim 1, wherein the second semiconductor layer is a laminated structure of a low impurity concentration semiconductor layer of a first conductivity type adjacent the first semiconductor layer, and an opposite conductivity type semiconductor layer of a second conductivity type adjacent the electrode.

10. The diode according to claim 9, wherein:
    the electrode is as an electrode via which an electric potential of the opposite conductivity type semiconductor layer in the second semiconductor layer can be retrieved, and
    the opposing electrode is an electrode via which an electric potential of the first semiconductor layer can be retrieved.

11. The diode according to claim 1, wherein the first semiconductor layer and the second semiconductor layer are group III-V nitride semiconductor layers.

12. The diode according to claim 1, wherein the first semiconductor layer and the second semiconductor layer are a gallium nitride (GaN), indium gallium nitride ($In_xGa_{1-x}N$: $0<x\leq1$) layers or an aluminum gallium nitride ($Al_xGa_{1-x}N$: $0<x\leq1$ layers).

13. A diode comprising:
    a semiconductor layer which is a compound semiconductor layer with a crystalline structure and a high dislocation density region which extends in the layer in a film thickness direction;
    an opening in the semiconductor layer which extends in the film thickness direction from a first side of the semiconductor layer toward a second side of the semiconductor layer opening coinciding with the high density dislocation region;
    an insulating film pattern covering an inner wall of the opening;
    an electrode overlapping the opening and covering the insulating film pattern and in contact with the semiconductor layer; and an opposing electrode adjacent the second side of the semiconductor layer in contact with the high dislocation density region,
wherein
application of a voltage across the electrode and the opposing electrode causes formation of a depletion layer that is shallower than the extent of the opening.

14. The diode of claim 1, wherein the opening has a diameter greater than an overall width of the high density dislocation region.

15. The diode of claim 1, wherein the electrode is a Schottky electrode with respect to the second semiconductor layer.

16. The diode of claim 1, wherein the insulating film pattern fills the opening.

17. The diode of claim 1, wherein the insulating film pattern has a thickness sufficient to avoid breakdown thereof due to an electric field with a voltage is applied across the electrode and the opposing electrode.

* * * * *